United States Patent
Suzuki et al.

(10) Patent No.: US 8,363,461 B2
(45) Date of Patent: Jan. 29, 2013

(54) MAGNETIC RANDOM ACCESS MEMORY, METHOD OF INITIALIZING MAGNETIC RANDOM ACCESS MEMORY AND METHOD OF WRITING MAGNETIC RANDOM ACCESS MEMORY

(75) Inventors: Tetsuhiro Suzuki, Tokyo (JP);
Shunsuke Fukami, Tokyo (JP);
Kiyokazu Nagahara, Tokyo (JP);
Norikazu Ohshima, Tokyo (JP);
Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 177 days.

(21) Appl. No.: 13/003,290

(22) PCT Filed: Jun. 26, 2009

(86) PCT No.: PCT/JP2009/061679
§ 371 (c)(1),
(2), (4) Date: Feb. 8, 2011

(87) PCT Pub. No.: WO2010/004881
PCT Pub. Date: Jan. 14, 2010

(65) Prior Publication Data
US 2011/0157967 A1 Jun. 30, 2011

(30) Foreign Application Priority Data
Jul. 10, 2008 (JP) .................... 2008-180306

(51) Int. Cl.
*G11C 11/00* (2006.01)
*G11C 11/14* (2006.01)
*G11C 11/15* (2006.01)

(52) U.S. Cl. .................. 365/158; 365/171; 365/173
(58) Field of Classification Search .......... 365/158, 365/171, 173
See application file for complete search history.

(56) References Cited

U.S. PATENT DOCUMENTS

| | | | |
|---|---|---|---|
| 6,834,005 B1 | 12/2004 | Parkin | |
| 7,532,502 B2 * | 5/2009 | Saito | 365/158 |
| 7,532,504 B2 * | 5/2009 | Saito | 365/158 |
| 7,859,881 B2 * | 12/2010 | Iwata et al. | 365/158 |
| 8,098,514 B2 * | 1/2012 | Nagase et al. | 365/158 |
| 8,159,872 B2 * | 4/2012 | Fukami et al. | 365/158 |
| 8,218,355 B2 * | 7/2012 | Kitagawa et al. | 365/158 |

FOREIGN PATENT DOCUMENTS

| | | |
|---|---|---|
| JP | 2005-093488 A | 4/2005 |
| JP | 2005-150303 A | 6/2005 |
| JP | 2005-191032 A | 7/2005 |
| JP | 2006-073930 A | 3/2006 |

(Continued)

*Primary Examiner* — Trong Phan
(74) *Attorney, Agent, or Firm* — Sughrue Mion, PLLC

(57) ABSTRACT

A magnetic memory includes a magnetization recording layer, a first terminal, a second terminal, a magnetization pinned layer and a non-magnetic layer. The magnetization recording layer has a vertical magnetic anisotropy and includes a ferromagnetic layer. The first terminal is connected to one end of a first region in the magnetization recording layer. The second terminal is connected to the other end of the first region. The non-magnetic layer is arranged on the first region. The magnetization pinned layer is arranged on the non-magnetic layer and is located on the side opposite to the first region. The magnetization recording layer includes: a first extension portion located outside the first terminal in the magnetization recording layer; and a property changing structure that is arranged in the first extension portion and substantially changes a magnetization switching property of the magnetization recording layer.

20 Claims, 10 Drawing Sheets

FOREIGN PATENT DOCUMENTS

| | | |
|---|---|---|
| JP | 2006-073960 A | 3/2006 |
| JP | 2006-270069 A | 10/2006 |
| JP | 2007-103663 A | 4/2007 |
| JP | 2008-034808 A | 2/2008 |
| WO | 2005/069368 A1 | 7/2005 |
| WO | 2007/119748 A1 | 10/2007 |
| WO | 2008/047536 A1 | 4/2008 |
| WO | 2009/093387 A1 | 7/2009 |

* cited by examiner

MAGNETIC RANDOM ACCESS MEMORY, METHOD OF INITIALIZING MAGNETIC RANDOM ACCESS MEMORY AND METHOD OF WRITING MAGNETIC RANDOM ACCESS MEMORY

TECHNICAL FIELD

The present invention relates to a magnetic random access memory (hereafter, referred to as MRAM), and more particularly relates to a domain wall motion MRAM.

BACKGROUND ART

MRAM is a nonvolatile memory that is promising from the viewpoint of a high integration and a high speed operation. In the MRAM, a magnetoresistive element indicating the magnetoresistive effect such as the TMR (Tunnel MagnetoResistance) effect is used. In the magnetoresistive element, for example, MTJ (Magnetic Tunnel Junction) in which a tunnel barrier layer is sandwiched between two ferromagnetic layers is formed. The two ferromagnetic layers are provided with: a magnetization pinned layer (pinned layer) in which a magnetization direction is pinned; and a magnetization free layer (free layer) in which a magnetization direction can be switched.

A resistance value (R+ΔR) of the MTJ when the magnetization directions of the pinned layer and the free layer are anti-parallel becomes higher than a resistance value (R) of the MTJ when the magnetization directions of the pinned layer and the free layer are parallel, because of the magnetoresistive effect. In the MRAM, the magnetoresistive element having this MTJ is used as a memory cell. Then, the memory cell stores a data in a nonvolatile manner by using variations in the resistance value of the MTJ. For example, an anti-parallel state is correlated to a data "1", and a parallel state is correlated to a data "0". Writing of the data to the memory cell is carried out by switching the magnetization direction of the free layer.

As a method of writing a data to the MRAM, the asteroid method and the toggle method are known. According to those writing methods, a switching magnetic field required to switch the magnetization of the free layer becomes great approximately inversely proportional to a memory cell size. In short, there is a tendency that a writing current is increased as a memory cell is miniaturized.

As a writing method that can suppress the increase in the writing current in association with the miniaturization of the memory cell, the spin transfer method is proposed (for example, Japanese Patent Publication No. JP-P 2005-93488A corresponding to U.S. Pat. No. 7,193,284). According to the spin transfer method, a spin-polarized current is injected to a ferromagnetic conductor. Consequently, the magnetization is switched by a direct interaction between the spin of conducting electrons of the current and the magnetic moment of the conductor (hereafter, referred to as a spin transfer magnetization switching).

U.S. Pat. No. 6,834,005B discloses a magnetic shift register that uses the spin transfer method. This magnetic shift register uses domain walls in a magnetic body and stores a data. In the magnetic body that is separated into many regions (magnetic domains) through the use of constrictions and the like, a current is injected to pass through the domain walls, and the domain walls are moved by the current. The direction of the magnetization of each region is treated as a record data. The foregoing magnetic shift register is used to record, for example, a large quantity of serial data.

The domain wall motion MRAM that uses a domain wall motion through the use of the foregoing spin transfer is described in Japanese Patent Publication No. JP-P 2005-191032A and WO2005/069368 (corresponding to US Application Publication 2008137405).

The MRAM described in JP-P 2005-191032A includes: a magnetization pinned layer in which a magnetization is fixed; a tunnel insulation layer which is laminated on the magnetization pinned layer; and a magnetization recording layer which is laminated on the tunnel insulation layer. The magnetization recording layer includes a portion in which the magnetization direction can be switched and a portion in which the magnetization direction is not substantially changed. Thus, it is referred to as the magnetization recording layer and not referred to as the magnetization free layer. FIG. 1 is a schematic view showing a structure of the magnetization recording layer in JP-P 2005-191032A. In FIG. 1, a magnetization recording layer 100 has a straight shape. The magnetization recording layer 100 includes a junction portion 103, constriction portions 104 and pairs of magnetization pinned portions 101 and 102. The junction portion 103 overlaps with a tunnel insulation layer (not shown) and a magnetization pinned layer (not shown). The constriction portions 104 are adjacent to both ends of the junction portion 103. The pair of magnetization pinned portions 101 and 102 is formed adjacently to the constriction portions 104. The pinned magnetizations opposite to each other are applied to the pair of magnetization pinned portions 101 and 102. Moreover, the MRAM includes a pair of writing terminals 105 and 106 electrically connected to the pair of magnetization pinned portions 101 and 102, respectively. Through these writing terminals 105 and 106, a current flows, which penetrates through the junction portion 103, the pair of constriction portions 104 and the pair of magnetization pinned portions 101 and 102 in the magnetization recording layer 100. The constriction portion 104 acts as a pin potential for the domain wall. A data is held on the basis of: whether the domain wall exists in the right constriction portion 104 or the left constriction portion 104; or the magnetization direction of the junction portion 103. The movement of the domain wall is controlled by the above current.

The MRAM described in WO2005/069368 uses a step as a means for forming a pin potential. FIG. 2 is a schematic view showing a structure of the magnetization recording layer in WO2005/069368. In FIG. 2, the magnetization recording layer 100 is provided with three regions that are different from each other in thickness. Specifically, the magnetization recording layer 100 is provided with the thickest first magnetization pinned layer 101, the second thickest second magnetization pinned layer 102, and the thinnest junction portion 103 arranged between them. Here, the reason why the thicknesses of the first magnetization pinned layer 101 and the second magnetization pinned layer 102 are different is that the pinned magnetizations opposite to each other are applied in an initializing process. Incidentally, in WO2005/069368, a magnetic semiconductor having an anisotropy vertical to a film surface is used as the magnetization recording layer, and the current for the sake of the domain wall motion is small such as 0.35 mA. Although the tunnel insulation layer and the magnetization pinned layer are arranged on the junction portion 103, they are omitted in FIG. 2. In FIG. 2, the steps at the boundaries between the junction portion 103 and the magnetization pinned layer 101 and between the junction portion 103 and the magnetization pinned layer 102 function as the pin potentials. For this reason, for example, a domain wall 112 remains at the boundary between the junction portion 103 and the magnetization pinned layer 101.

In this way, the domain wall motion MRAM disclosed in the above documents is required to be designed such that the constrictions, the steps and the like are used to generate the pin potentials, and the domain wall constrained therein is moved through the use of the current.

On the other hand, Japanese Patent Publication No. JP-P 2008-34808A (corresponding to US Application Publication No. 2008025060) discloses a method of controlling a domain wall position without any constriction. FIG. 3 is a schematic view showing a magnetization structure of a magnetic storage in JP-P 2008-34808A. In a magnetic wire 140, a plurality of magnetic domains 130 is formed through the use of a plurality of domain walls 135 along its longitudinal direction. Any constriction or any step is not arranged in the magnetic wire. The movement of the domain wall is carried out by a magnetic field or a current pulse, and a domain wall motion distance is controlled on the basis of the width of a pulse. FIG. 4 is a graph showing a relation between a pulse application time (horizontal axis) and a domain wall position (vertical axis) calculated by a simulation. As shown in the curve A, the domain wall has a tendency in which a movement speed becomes 0 and the domain wall stops at a particular time. In JP-P2008-34808A, the pulse application time is set to this stop time, and the domain wall position is controlled.

As the related technique, Japanese Patent Publication No. JP-P 2006-73930A discloses a method of changing a magnetization state of a magnetoresistive effect element that uses a domain wall motion, and a magnetic memory element and a solid magnetic memory that uses the method. This magnetic memory element is the magnetic memory element that includes a first magnetic layer, a middle layer and a second magnetic layer and records a data by using the magnetization directions of the first magnetic layer and the second magnetic layer. The magnetic memory element steadily forms the magnetic domains that exhibit the magnetizations anti-parallel to each other inside at least one magnetic layer and the domain wall that separates these magnetic domains. Then, the magnetic memory element moves the domain wall inside the magnetic layer, and consequently controls the positions of the magnetic domains adjacent to each other to record the data.

Also, as the related art, Japanese Patent Publication No. JP-P 2006-270069A discloses a magnetoresistive effect element and a high speed magnetic recording apparatus, which are based the domain wall motion through the use of a pulse current. This magnetoresistive effect element has a first magnetization pinned layer/a magnetization free layer/a second magnetization pinned layer. This magnetoresistive effect element includes a mechanism for inducing a domain wall generation in a transition region between the magnetization pinned layer and the magnetization free layer, which serves as at least one boundary between the first magnetization pinned layer/the magnetization free layer or between the magnetization free layer/the second magnetization pinned layer. Then, the magnetization directions of these magnetization pinned layers are set approximately anti-parallel, and the domain wall exists in any one of the transition regions of the magnetization pinned layer/the magnetization free layer. In this structure, when the current of a predetermined pulse width is supplied, at the current that does not exceed a direct current density of $10^6$ A/cm$^2$, the domain wall moves between the two transition regions. Hence, the magnetization of the magnetization free layer is switched, thereby detecting the magnetic resistance associated with the change in the direction of a relative magnetization.

CITATION LIST

Patent Literature

Patent literature 1: JP-P 2005-93488A
Patent literature 2: U.S. Pat. No. 6,834,005B
Patent literature 3: JP-P 2005-191032A
Patent literature 4: WO2005/069368
Patent literature 5: JP-P 2008-34808A
Patent literature 6: JP-P 2006-73930A
Patent literature 7: JP-P 2006-270069A

SUMMARY OF INVENTION

However, there is concern that the method of generating the pin potentials disclosed in the above JP-P 2005-191032A does not become effective on the MRAM, which uses the current drive domain wall motion. That is, it is difficult to form the constrictions as described in JP-P 2005-191032A when the width of the magnetization recording layer is narrow, and there is a possibility that the process with the precision equal to or higher than a lithography limit of a semiconductor process is required.

Also, in order to form the two steps as described in WO2005/069368, the exposing process is required to be repeated twice. This implies the increase in the number of processes, and there is concern that this leads to a factor of the cost increase.

On the other hand, if the domain wall motion distance control through the use of the pulse width as described in JP-P 2008-34808A is applied to the domain wall motion MRAM, the above two problems are solved. However, the manner of the motion of the domain wall is not always limited to the stopping during the pulse application as indicated by the curve A. That is, as indicated by the curve B, as the motion of the domain wall, although there is the increase or decrease in the motion speed, there is a case that it continues to move without any stopping. According to the simulation, in particular, in the magnetization recording layer that has a vertical anisotropy in which the current density for the domain wall motion is small, the tendency of the non-stopping is remarkable. Also, in the case of the method of JP-P 2008-34808A, there is an aspect that it is unsuitable for the MRAM to be applied, in which the miniaturization of a cell size is required, because the domain wall motion distance is uniquely determined.

An object of the present invention is to provide a current drive domain wall motion MRAM that is adaptable for a miniaturization of an element and has a structure in which the number of processes is small, and a method of initializing a MRAM that introduces a domain wall into its structure and carries out an initialization.

A magnetic memory cell of the present invention includes a magnetization recording layer, a first terminal, a second terminal, a magnetization pinned layer and a non-magnetic layer. The magnetization recording layer has a vertical magnetic anisotropy and includes a ferromagnetic layer. The first terminal is connected to one end of a first region in the magnetization recording layer. The second terminal is connected to the other end of the first region. The non-magnetic layer is arranged on the first region. The magnetization pinned layer is arranged on the non-magnetic layer and is located on the side opposite to the first region. The magnetization recording layer includes: a first extension portion located outside the first terminal in the magnetization recording layer; and a property changing structure that is arranged in the first extension portion and substantially changes a magnetization switching property of the magnetization recording layer.

A magnetic random access memory of the present invention includes a plurality of magnetic memory cells and a writing current supplying circuit. The plurality of magnetic memory cells is arranged in a matrix shape and described in the above paragraphs. The writing current supplying circuit supplies a writing current at a time of a writing operation for the plurality of magnetic memory cells.

In a method of initializing a magnetic random access memory of the present invention, the magnetic random access memory includes: a plurality of magnetic memory cells arranged in a matrix shape; and a writing current supplying circuit supplying a writing current at the time of a writing operation for the plurality of magnetic memory cells. Each of the plurality of magnetic memory cells includes: a magnetization recording layer having a vertical magnetic anisotropy and including a ferromagnetic layer; a first terminal connected to one end of a first region in the magnetization recording layer; and a second terminal connected to the other end of the first region. A non-magnetic layer is arranged on the first region, and a magnetization pinned layer is arranged on the non-magnetic layer and is located on the side opposite to the first region. The magnetization recording layer includes: a first extension portion located outside the first terminal in the magnetization recording layer; and a property changing structure that is arranged in the first extension portion and substantially changes a magnetization switching property of the magnetization recording layer.

The method of initializing the magnetic random access memory of the present invention executes a step of: applying a magnetic field to a first direction to orient all magnetizations of the magnetization recording layer to the first direction; applying a magnetic field to a second direction opposite to the first direction to orient a magnetization of a region, where the property changing structure is not arranged, to the second direction such that a domain wall is generated; applying a magnetic field to the first direction to introduce the domain wall into the first region; and supplying a current between the first terminal and the second terminal to drive the domain wall to a vicinity of the second terminal.

The method of initializing the magnetic random access memory of the present invention executes a step of: applying a magnetic field to a first direction to orient all magnetizations of the magnetization recording layer to the first direction; applying a magnetic field to a second direction opposite to the first direction to orient a magnetization of a region, where the property changing structure is arranged, to the second direction such that a domain wall is generated; applying a magnetic field to the second direction to introduce the domain wall into the first region; and supplying a current between the first terminal and the second terminal to drive the domain wall to a vicinity of the second terminal.

A method of writing the magnetic random access memory of the present invention executes a step of: rising up a writing current pulse in a first time period; and falling the writing current pulse in a second time period longer than the first time period.

According to the present invention, in a domain wall motion MRAM that uses a magnetic layer having a vertical magnetic anisotropy, it is possible to easily initialize a domain wall position. As a result, it is possible to provide the MRAM that has the large capacity and the small number of processes.

BRIEF DESCRIPTION OF EMBODIMENTS

A MRAM according to an exemplary embodiment of the present invention and a method of initializing a MRAM will be described below with reference to attached drawings.

The MRAM according to the exemplary embodiment is a domain wall motion MRAM that uses a magnetic layer having a vertical magnetic anisotropy.

1. Configuration of Magnetic Memory Cell

Figure 1:
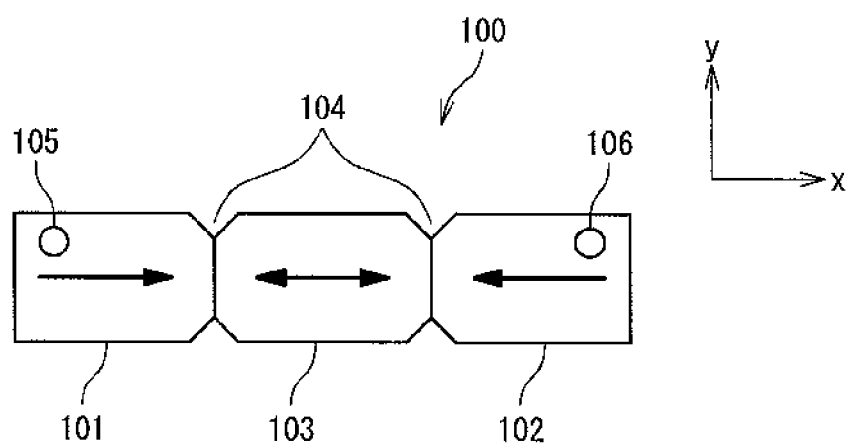
FIG. 1 is a schematic view showing a structure of a magnetization recording layer of JP-P 2005-191032A.
Figure 2:
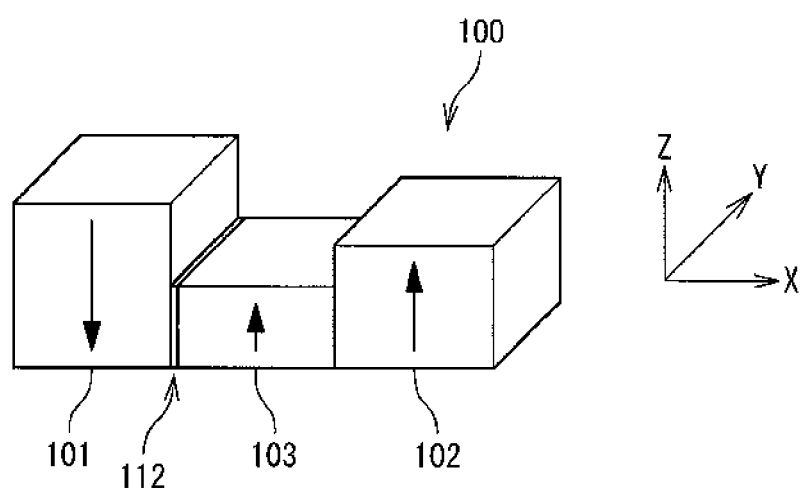
FIG. 2 is a schematic view showing a structure of a magnetization recording layer of WO2005/069368.
Figure 3:
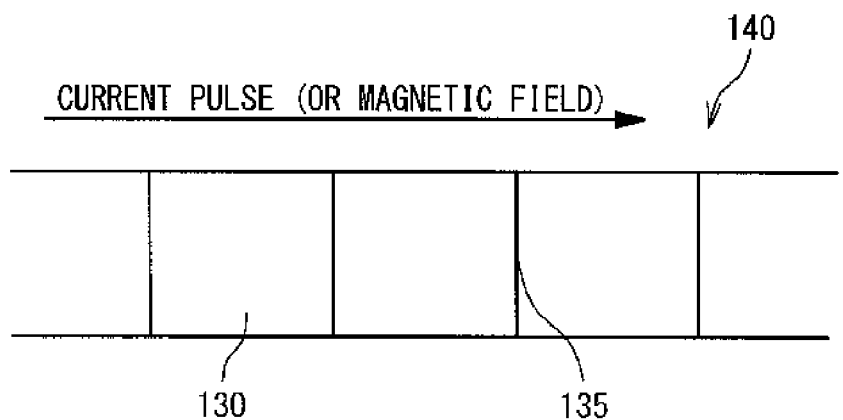
FIG. 3 is a schematic view showing a magnetization structure of a magnetic storage of JP-P 2008-34808A.
Figure 4:
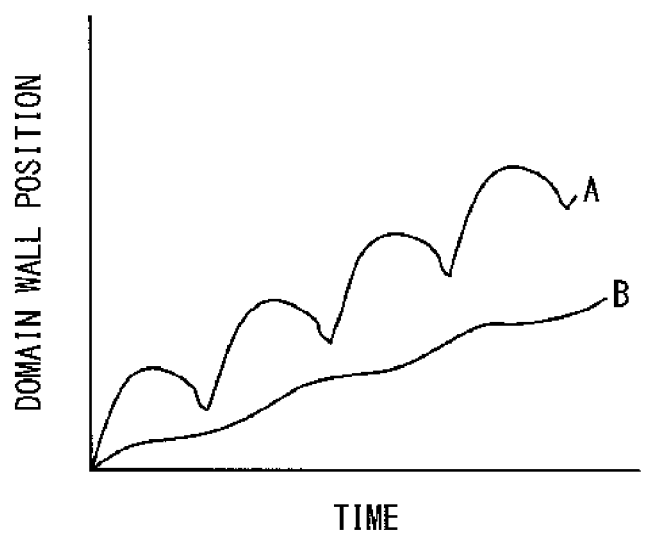
FIG. 4 is a graph showing a relation between a pulse application time and a domain wall position through a simulation.
Figure 5:
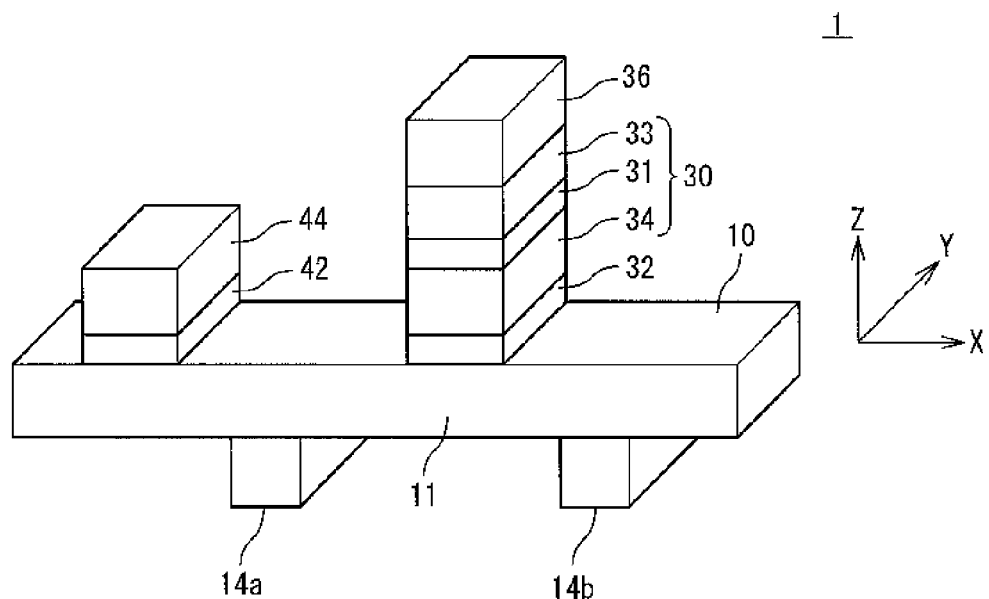
FIG. 5 is a perspective view showing one example of a magnetoresistive element in a magnetic memory cell according to an exemplary embodiment.

At first, a configuration of a magnetic memory cell used in the MRAM will be described. FIG. 5 is a perspective view showing one example of a magnetoresistive element in the magnetic memory cell according to the present exemplary embodiment. A magnetoresistive element 1 includes a magnetization recording layer 10, a tunnel barrier layer 32 (non-magnetic layer) arranged on a first region 11 in the magnetization recording layer 10, and a pinned layer 30 (magnetization pinned layer) arranged on the tunnel barrier layer 32. Here, the first region 11 is the region included in the magnetization recording layer 10 and located between a first terminal 14a (described later) and a second terminal 14b (described later). The magnetization recording layer 10 and the pinned layer 30 are ferromagnetic layers. The tunnel barrier layer 32 is the non-magnetic layer. The tunnel barrier layer 32 is sandwiched between the magnetization recording layer 10 and the pinned layer 30. A magnetic tunnel junction (MTJ) is formed by the magnetization recording layer 10, the tunnel barrier layer 32 and the pinned layer 30.

A magnetization direction of the pinned layer 30 is not changed by any of a writing operation and a reading operation. For this reason, a magnetic anisotropy of the pinned layer 30 is desired to be greater than a magnetic anisotropy of the magnetization recording layer 10. This is attained by changing materials and/or compositions of the magnetization recording layer 10 and the pinned layer 30. Also, this is attained by laminating an anti-ferromagnetic layer 36 on the surface opposite to the tunnel barrier layer 32 in the pinned layer 30 to pin the magnetization. Moreover, the pinned layer 30 can be provided with a ferromagnetic layer 34, a non-magnetic layer 31 and a ferromagnetic layer 33. Here, as the non-magnetic layer 31, Ru, Cu and the like are used. The magnetizations of the two ferromagnetic layers 33 and 34 become anti-parallel to each other through Ru, Cu and the like. If the magnetizations of the two ferromagnetic layers 33 and 34 are made substantially equal, a leakage magnetic field from the pinned layer 30 can be suppressed.

The magnetization recording layer 10 has the anisotropy in the direction vertical to the substrate surface. It is desired to include at least one or more materials selected from Fe, Co and Ni in the magnetization recording layer 10. Moreover, in order to stabilize the vertical magnetic anisotropy, it is desired to include Pt and Pd. In addition, by adding B, C, N, O, Al, Si, P, Ti, V, Cr, Mn, Cu, Zn, Zr, Nb, Mo, Tc, Ru, Rh, Ag, Hf, Ta, W, Re, OS, Ir, Au, Sm and the like, it is possible to adjust a magnetic property to be desirable. Specifically, as the material of the magnetization recording layer 10, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd and Sm—Co are exemplified. In addition, by a layer including at least one material selected from Fe, Co and Ni is laminated on a different layer, the magnetic anisotropy in the vertical direction can be also generated. In that case, specifically, the lamination films of Co/Pd, Co/Pt, Co/Ni and Fe/Au are exemplified as the magnetization recording layer 10. It is also desired that the pinned layer 30 has the vertical magnetic anisotropy by using the material similar to the magnetization recording layer 10. The tunnel barrier layer 32 is a thin insulation film such as an $Al_2O_3$ film, an MgO film or the like. Material whose TMR effect is great such as CoFe, CoFeB or the like may be used in the magnetization recording layer 10 and/or a part of the pinned layer 30, in particular, a portion in contact with the tunnel barrier layer 32.

The first terminal 14a and the second terminal 14b, which are intended to supply a writing current, are connected to the magnetization recording layer 10. In accordance with an initializing operation that will be described later, a domain wall is introduced between the first terminal 14a and the second terminal 14b. The domain wall is driven on the basis of the writing current. Attention should be paid to a fact that an artificial structure to generate a pin potential such as a constriction or a step does not exist between the first terminal 14a and the second terminal 14b. The portion in which the tunnel barrier layer 32 and the pinned layer 30 are laminated to form the MTJ must include the portion between the first terminal 14a and the second terminal 14b in the magnetization recording layer 10. This is because the magnetization direction of the portion between them is changed as the result of the writing operation. Incidentally, the first terminal 14a and the second terminal 14b may be located on any of upper and lower portions of the magnetization recording layer 10, and they may be formed by a via forming process, a head forming process or the like.

The magnetization recording layer 10 has a structure (property changing structure) for an initializing operation of a domain wall introduction into a region (extension portion extended to the side opposite to the MTJ) outside the first terminal 14a. In FIG. 5, this structure is provided with an insulating layer 42 and a ferromagnetic layer 44. Those layers may be formed simultaneously with the tunnel barrier layer 32 and the ferromagnetic layer 34 forming the MTJ. A role of this structure lies in a mechanism, as described later in an initializing method, that a magneto-static or exchanging magnetic bias magnetic field is applied to a part of the magnetization recording layer 10 to change the switching property of the magnetization. For this reason, as this structure, the tunnel barrier layer 42 may be omitted, or a non-magnetic metal may be arranged instead of the tunnel barrier layer 42. Also, as this structure, instead of the ferromagnetic layer 44, an anti-ferromagnetic layer may be arranged directly adjacent to the magnetization recording layer 10.

It is preferred that the magnetization recording layer 10 has a region (an extension portion extended to the side opposite to the MTJ) outside the second terminal 14b. As described later, this is because, when the domain wall moves and comes to the vicinity of the second terminal 14b, the domain wall does not pass through the end of the second terminal 14b side. However, it is not necessary to have the structure (property changing structure) for the initializing operation of the domain wall introduction in the region. Hence, the configuration of the magnetoresistive element 1 can be simplified.

Figure 6:
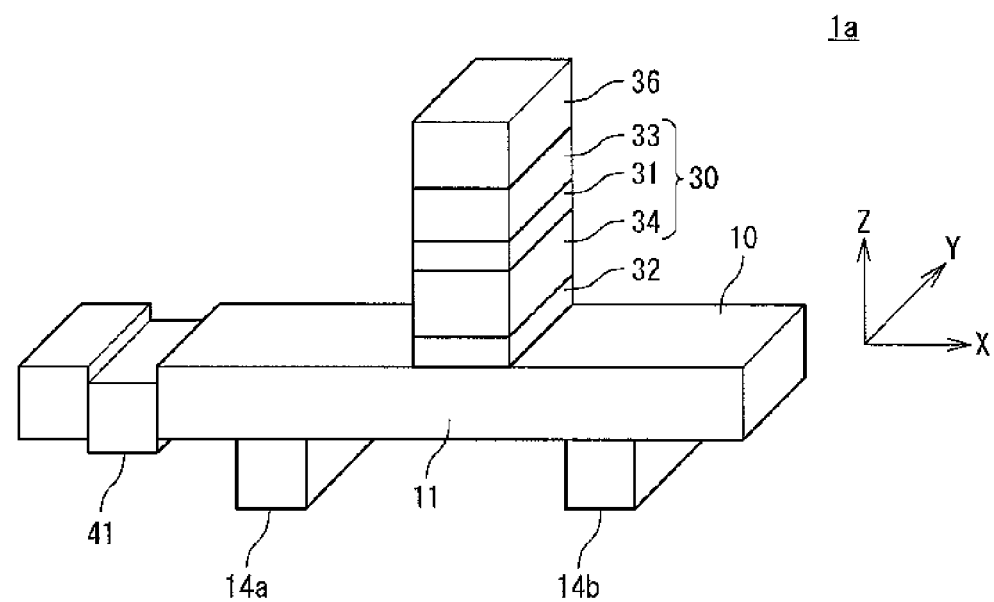
FIG. 6 is a perspective view showing another example of the magnetoresistive element in the magnetic memory cell according to the exemplary embodiment.
Figure 7:
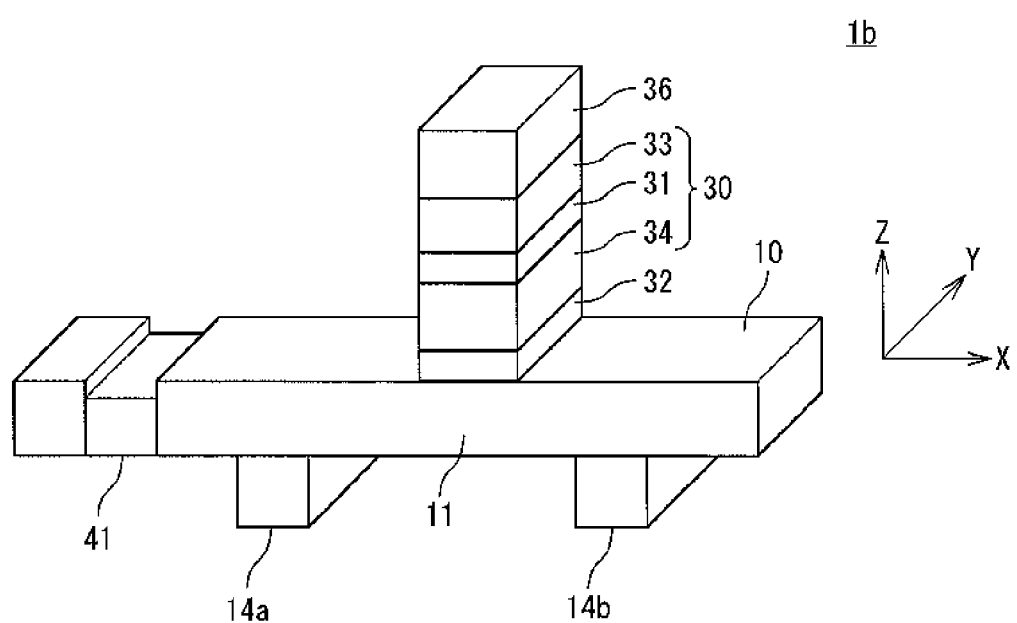
FIG. 7 is a perspective view showing another example of the magnetoresistive element in the magnetic memory cell according to the exemplary embodiment.

FIGS. 6 and 7 are perspective views showing other examples of the magnetoresistive element in the magnetic memory cell according to the present exemplary embodiment. Those magnetoresistive elements 1a and 1b are different in a structure 41 (property changing structure) for the initialization from the magnetoresistive element 1 in FIG. 5. In the example in FIG. 6, as the structure 41, a step is arranged in a part of the magnetization recording layer 10 outside the first terminal 14a. By preliminarily preparing a hole in a ground portion, on which the step is formed, using an etching process and then forming a film serving as the magnetization recording layer 10, the step can be easily introduced into the magnetization recording layer 10. The step facilitates the formation of a magnetization switching center, thereby changing the magnetic property of the magnetization recording layer 10. On the other hand, in the example in FIG. 7, as the structure 41, the step is arranged on a surface of a part (thin film portion) of the magnetization recording layer 10 outside the first terminal 14a. By etching a predetermined portion in the magnetization recording layer 10, the step (thin film portion) can be easily introduced into the magnetization recording layer 10. The step facilitates the formation of a magnetization switching center, thereby changing the magnetic property of the magnetization recording layer 10.

2. Initialization of Magnetization Pinned Region

A method of initializing a MRAM according to the exemplary embodiment of the present invention, namely, the domain wall introduction will be described below. FIGS. 8A to 8D are sectional views showing the method of initializing the MRAM according to the present exemplary embodiment of the present invention. Here, it is assumed that a coercive force of the pinned layer 30 is sufficiently greater than a coercive force of the magnetization recording layer 10 and that the magnetization direction is not changed at an initializing process, and thus the pinned layer 30 is not shown here. Also, outside the first terminal 14*a*, similarly to FIG. 5, it is assumed that the ferromagnetic layer 44 is laminated through the insulating layer 42 (however, the insulating layer 42 is not shown in the drawings). Solid white arrows in respective portions in the respective drawings indicate the magnetization directions in the corresponding portions.

Figure 8A:
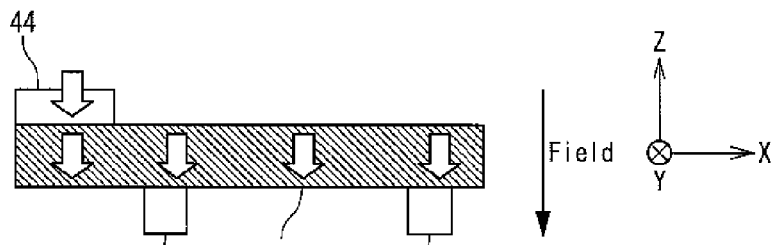
FIG. 8A is a sectional view showing a method of initializing a MRAM according to the exemplary embodiment.
Figure 8B:
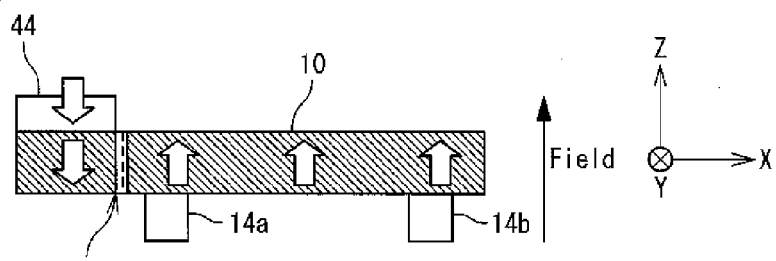
FIG. 8B is a sectional view showing the method of initializing the MRAM according to the exemplary embodiment.

First, as shown in FIG. 8A, when a great magnetic field is applied to a −Z direction (first direction), all of the magnetizations of the magnetization recording layer 10 (including the ferromagnetic layer 44) is oriented to the −Z direction (Step 1). Next, as shown in FIG. 8B, when a magnetic field in the +Z direction (second direction) is gradually made great, the magnetizations of portions on which the ferromagnetic layer 44 are not laminated in the magnetization recording layer 10 are switched (Step 2). This is because in the portion on which the ferromagnetic layer 44 is laminated in the magnetization recording layer 10, the magneto-static coupling to the ferromagnetic layer 44 causes the magnetization switching to be difficult. At this time, a domain wall 12 is formed in the boundary between the portion on which the ferromagnetic layer 44 is laminated and the portion on which the ferromagnetic layer 44 is not laminated in the magnetization recording layer 10.

Figure 8C:
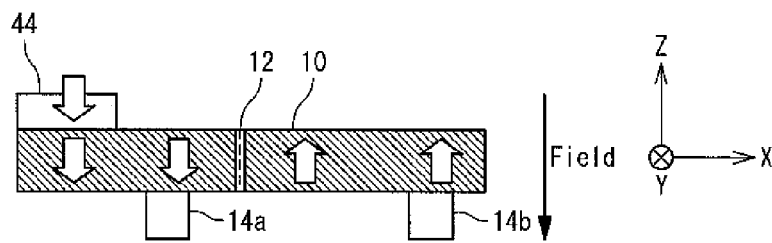
FIG. 8C is a sectional view showing the method of initializing the MRAM according to the exemplary embodiment.
Figure 8D:
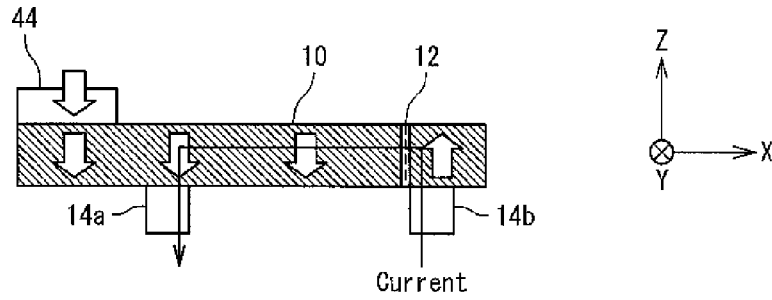
FIG. 8D is a sectional view showing the method of initializing the MRAM according to the exemplary embodiment.

Then, as shown in FIG. 8C, when the direction of the magnetic field is switched and the magnetic field in the −Z direction is gradually made great, the domain wall 12 is de-pinned and moves to the direction of the position of the second terminal 14 exceeding the position of the first terminal 14*a* (Step 3). At this time, it is required that the value of the magnetic field is set to the vicinity of the de-pinned magnetic field. This is because, when the magnetic field is excessively great, the domain wall motion speed is made higher, which causes the domain wall to pass through the second terminal 14*b* and depart from the right end. Whether or not the position of the domain wall is located between the first terminal 14*a* and the second terminal 14*b* is judged by monitoring the signal of the MTJ laminated on this region. Simultaneously with the change in the signal of the MTJ, the magnetic field is turned off, and the domain wall 12 is introduced between the first terminal 14*a* and the second terminal 14*b*. Moreover, as shown in FIG. 8D, by supplying a current from the second terminal 14*b* to the first terminal 14*a*, the domain wall 12 is moved to the vicinity of the second terminal 14*b* (Step 4). Finally, by turning off the current, the domain wall 12 is initialized to the vicinity of the second terminal 14*b*. The behavior of the domain wall 12 when the current is turned off will be described in detail in the writing operation that will be described later.

In the above-mentioned initializing operation, even if all of the magnetic field directions are set to the opposite direction, it is natural to obtain the desirable initialization state.

When the magnetoresistive elements 1*a* and 1*b* shown in FIGS. 6 and 7 are used, the initializing structure 41 (property changing structure) such as the step or the etching region is arranged outside the first terminal 14*a*, and the magnetization switching center formation is facilitated in the portion. In that case, at the step 2 in FIG. 8B, only the magnetization of the structure 41 is switched by the low magnetic field, and the domain wall 12 is introduced. Thus, the magnetic field required when the domain wall 12 is introduced between the first terminal 14*a* and the second terminal 14*b* at the step 3 becomes the magnetic field in the +Z direction.

3. Writing Operation and Reading Operation

Figure 9:
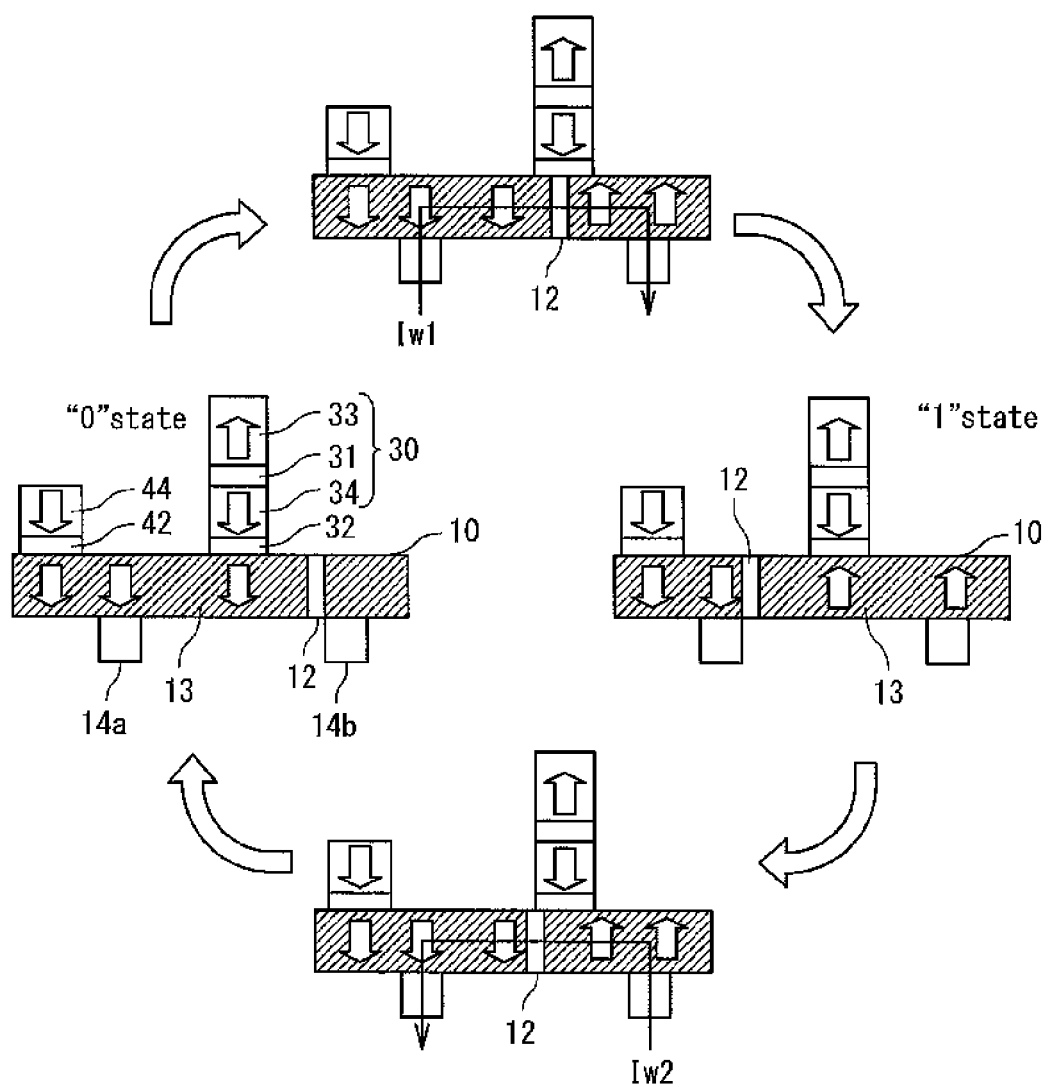
FIG. 9 shows a writing principle of a data to the magnetic memory cell in FIG. 5.

A writing principle of the data to the magnetic memory cell will be described below. FIG. 9 shows a writing principle of a data to the magnetic memory cell (magnetoresistive element 1) having the structure shown in FIG. 5. Here, it is assumed that the magnetization direction of the magnetization recording layer 10 is initialized by the above initializing operation. With regard to the magnetization recording layer 10, in the following writing operation, the region between the first terminal 14*a* and the second terminal 14*b*, in which the magnetization is switched, is referred to as a magnetization switching region 13.

The data writing is carried out by the domain wall motion method using a spin transfer. A writing current $I_w$ flatly flows inside the magnetization recording layer 10 and not in a direction penetrating through the MTJ. The writing current $I_w$ is supplied from the foregoing first terminal 14*a* and second terminal 14*b* to the magnetization recording layer 10. A state in which the magnetization direction of the magnetization switching region 13 and the magnetization direction of the ferromagnetic layer 34 in the pinned layer 30 are parallel is correlated to a data "0". In the data "0" state, the magnetization direction of the magnetization switching region 13 is the −Z direction, and the domain wall 12 exists in the vicinity of the second terminal 14*b*. On the other hand, a state in which the magnetization direction of the magnetization switching region 13 and the magnetization direction of the ferromagnetic layer 34 in the pinned layer 30 are anti-parallel is correlated to a data "1". In the data "1" state, the magnetization direction of the magnetization switching region 13 is the +Z direction, and the domain wall 12 exists in the vicinity of the first terminal 14*a*.

At the time of the writing operation of the data "1", a first writing current $I_{w1}$ flows from the first terminal 14*a* through the magnetization switching region 13 to the second terminal 14*b*. In this case, spin electrons are transferred to the magnetization switching region 13, from the portion having the magnetization of the +Z direction of the magnetization recording layer 10. The spin of the transferred electrons drives the domain wall 12, which exists in the vicinity of the second terminal 14*b*, to the direction of the first terminal 14*a*. As a result, the magnetization direction of the magnetization switching region 13 is switched to the +Z direction. In short, with the spin transfer effect, the magnetization of the magnetization switching region 13 is switched, thereby changing the magnetization direction to the +Z direction. Although the extension portion of the magnetization recording layer 10 exists even on the outside (the left in FIG. 9) of the first terminal 14*a*, the first writing current $I_{w1}$ does not flow through the extension portion outside the first terminal 14*a*. For this reason, the domain wall 12 is never driven to exceed the first terminal 14*a*.

Figure 10:
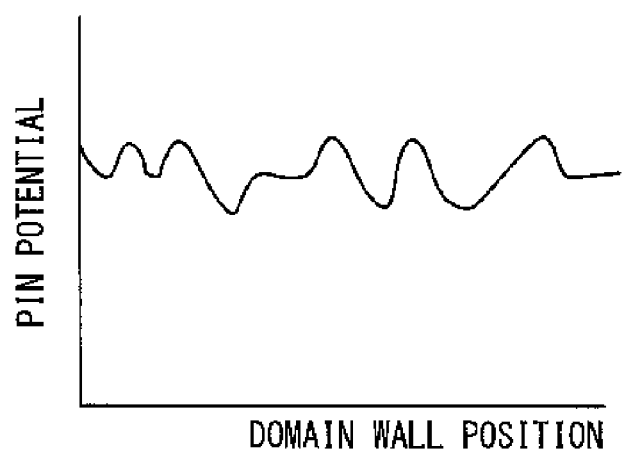
FIG. 10 is a graph showing a relation between a domain wall position and a pin potential of the magnetization recording layer.
Figure 11:
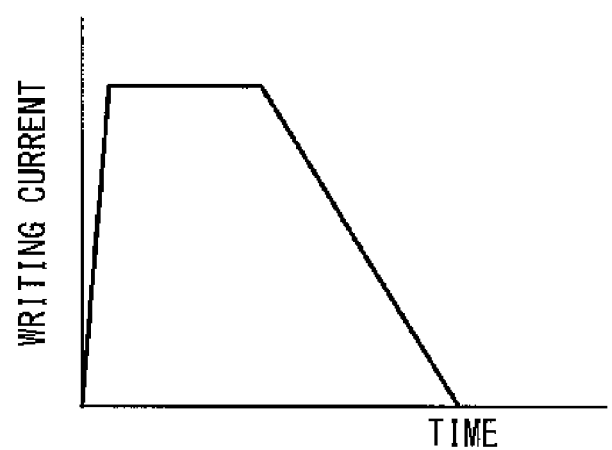
FIG. 11 is a graph showing a relation between a writing current value and a time in a writing operation.

Here, the reason why the domain wall 12 remains in the vicinity of the first terminal 14*a* after the first writing current $I_{w1}$ is turned off although the artificial pin potential is not generated will be described below. Here, FIG. 10 is a graph showing a relation between the domain wall position of the magnetization recording layer 10 and the pin potential. FIG. 11 is a graph showing a relation between the value of the writing current and the time at the writing operation. In the magnetization recording layer 10, because of the roughness on the end surface at the time of patterning, the distribution of lattice defects, the boundary between crystal grains and the like, there are random potentials as shown in FIG. 10. Since the value of the potential is relatively increased when the width of the magnetization recording layer 10 is miniaturized, this potential functions as the site that pins the domain wall 12. Also, in order to stabilize and settle the domain wall 12 to the random potential in the vicinity of the first terminal 14*a* after the first writing current $I_{w1}$ is turned off, as shown in FIG. 11, it is effective to make a falling time period of the writing current pulse longer than a rising time period of the writing current pulse. This is because the motion of the domain wall 12 that is driven by the current depends on the temporal change in the writing current. That is, making the falling time period long provides an effect of increasing a rate at which the energy for the current drive is dispersed and consequently an effect of making the convergence of the motion of the domain wall 12 easy.

On the other hand, at the time of the writing operation of the data "0", a second writing current $I_{w2}$ flows from the second terminal 14b through the magnetization switching region 13 to the first terminal 14a. In this case, the spin electrons are transferred to the magnetization switching region 13, from the portion having the magnetization in the –Z direction of the magnetization recording layer 10. The spin of the transferred electrons drives the domain wall 12, which exists in the vicinity of the first terminal 14a, to the direction of the second terminal 14b. As a result, the magnetization direction of the magnetization switching region 13 is switched to the –Z direction. In short, with the spin transfer effect, the magnetization of the magnetization switching region is switched, thereby changing the magnetization direction to the –Z direction. Although the extension portion of the magnetization recording layer 10 exists on the outside (the right in FIG. 9) of the second terminal 14b, the second writing current $I_{w2}$ does not flow through the extension portion outside the second terminal 14b. For this reason, the domain wall 12 is never driven to exceed the second terminal 14b. In this way, the magnetization direction of the magnetization switching region 13 is switched by the writing currents $I_{w1}$ and $I_{w2}$ flowing flatly inside the magnetization recording layer 10.

Incidentally, a reading operation of a data is carried out as follows. At the time of the data reading operation, a reading current is supplied to flow between the pinned layer 30 and the magnetization switching region 13. For example, the reading current flows from one of the first terminal 14a and the second terminal 14b through the magnetization switching region 13 and the tunnel barrier layer 32 to the ferromagnetic layer 34 in the pinned layer 30. Or, the reading current flows from the ferromagnetic layer 34 through the tunnel barrier layer 32 and the magnetization switching region 13 to one of the first terminal 14a and the second terminal 14b. On the basis of the reading current or reading potential, the resistance value of the magnetoresistive element 1 is detected, and the magnetization direction of the magnetization switching region 13 is sensed.

In the present invention, the insulating layer 42 and the ferromagnetic layer 44, which are intended to initialize the domain wall 12, are formed outside of the first terminal 14a. However, at the writing operation and the reading operation, the current does not flow through those layers. That is, the configuration arranged for the initializing operation does not have influence on the writing and reading operations of the present invention.

4. Variation Example

Figure 12:
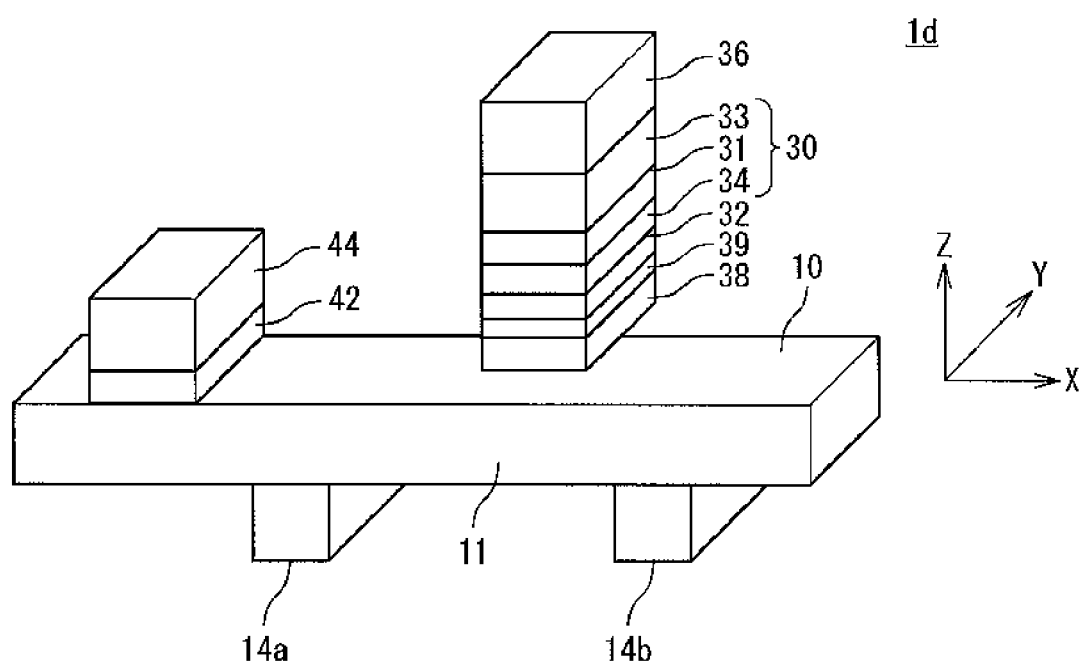
FIG. 12 is a perspective view showing a variation example of the magnetoresistive element in the magnetic memory cell according to the exemplary embodiment.

FIG. 12 is a perspective view showing a variation example of the magnetoresistive element in the magnetic memory cell according to this exemplary embodiment. In this variation example, a magnetoresistive element 1d includes a separation metal layer 38 and a sensor layer 39 between the tunnel barrier layer 32 and the magnetization recording layer 10. In addition, the lamination films above the sensor layer 39 are arranged at the positions offset in a Y-direction from the magnetization recording layer 10. Also, in this variation example, for each of the sensor layer 39 and the pinned layer 30, the magnetic material having not the perpendicular magnetic anisotropy but the in-plane magnetic anisotropy is used.

Figure 13A:
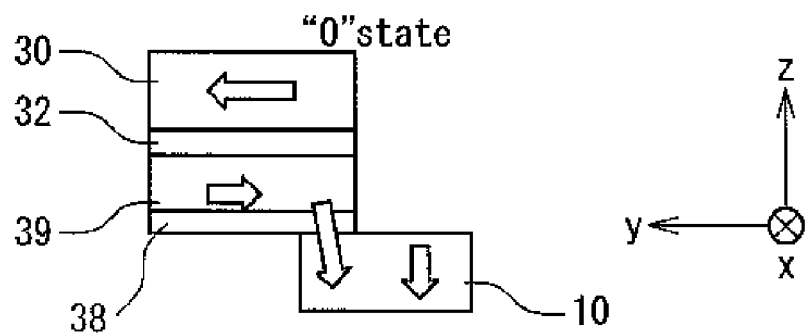
FIG. 13A is a sectional view showing a relation between the data of the magnetic memory cell in FIG. 12 and the magnetization state.
Figure 13B:
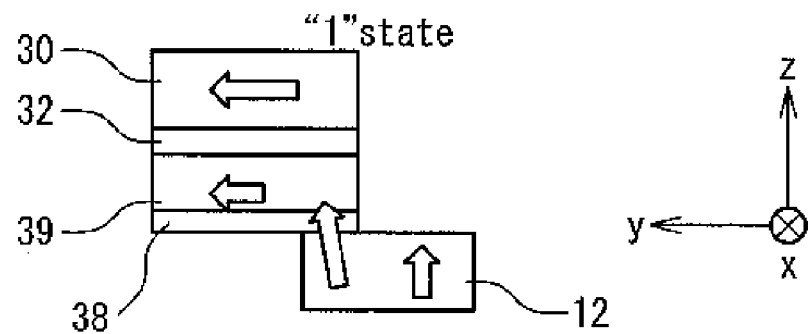
FIG. 13B is a sectional view showing a relation between the data of the magnetic memory cell in FIG. 12 and the magnetization state.

FIG. 13A and FIG. 13B are sectional views showing relations between data of the magnetic memory cell (magnetoresistive element 1d) having the structure shown in FIG. 12 and the magnetization states. FIG. 13A shows the state of the data "0", and FIG. 13B shows the state of the data "1", respectively. The magnetoresistive element 1d is characterized in that, since the leakage magnetic field from the magnetization recording layer 10 rotates the magnetization of the sensor layer 39, the magnetization direction of the magnetization recording layer 10 is indirectly read by using the in-plane MTJ film composed of the sensor layer 39, the tunnel barrier layer 32 and the pinned layer 30. The initializing method, the writing method and the reading method in this variation example are similar to FIG. 9.

5. Configuration of MRAM

Figure 14:
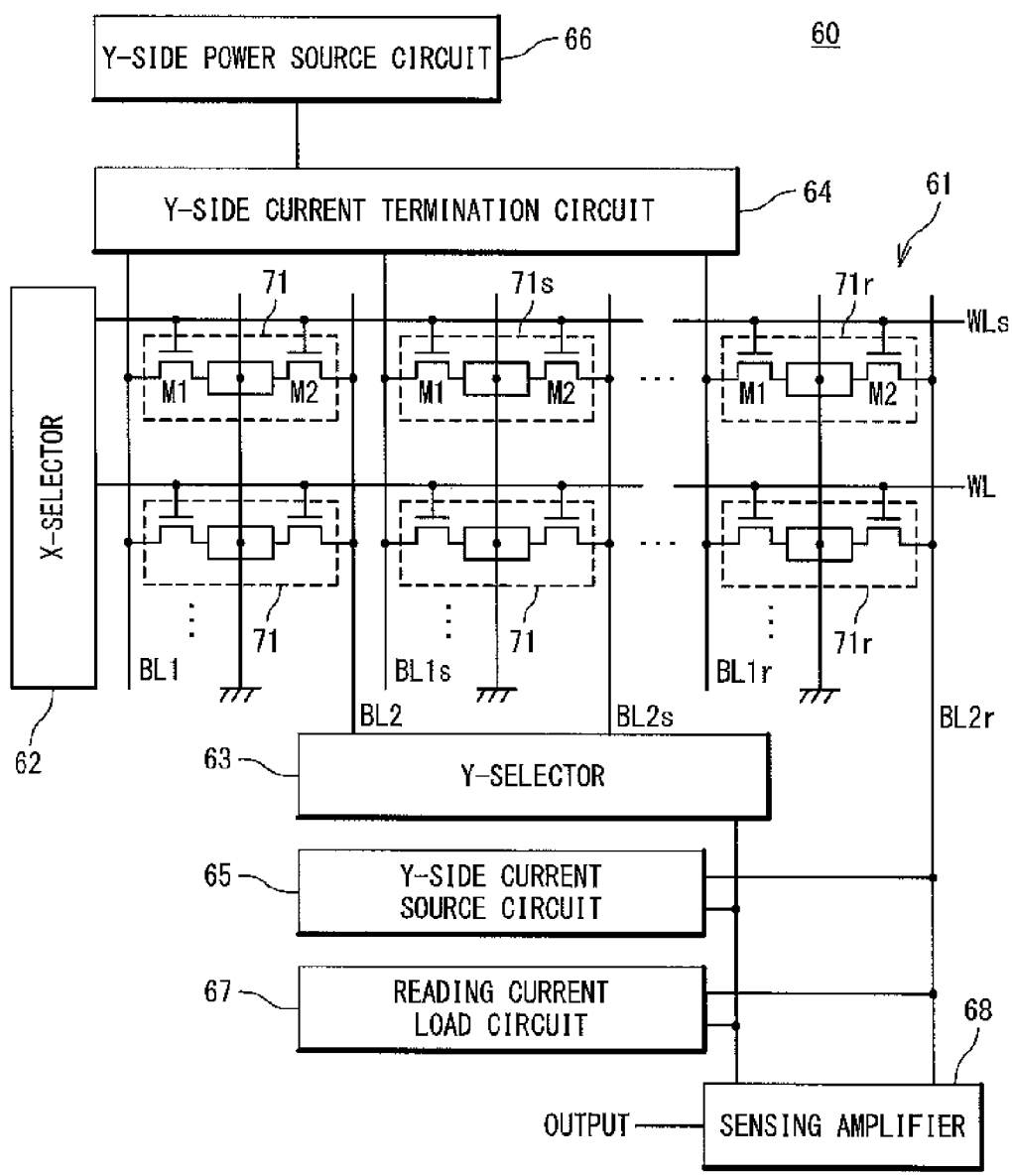
FIG. 14 is a block diagram showing one example of a configuration of the MRAM according to the exemplary embodiment.

FIG. 14 is a block diagram showing one example of a configuration of a MRAM according to the present exemplary embodiment. In FIG. 14, a MRAM 60 includes a memory cell array 61 in which a plurality of magnetic memory cells 71 are arranged in the shape of a matrix. This memory cell array 61 includes a reference cell 71r that is referred when a data is read, together with the magnetic memory cell 71 used for recording a data. The structure of the reference cell 71r is equal to the magnetic memory cell 71.

Each magnetic memory cell 71 includes selection transistors M1 and M2, for example, in addition to the magnetoresistive element 1 shown in FIG. 5. One of a source and a drain of the selection transistor M1 is connected to the first terminal 14a in the magnetization recording layer 10, and the other is connected to a first bit line BL1. One of a source and a drain of the selection transistor M2 is connected to the second terminal 14b in the magnetization recording layer 10, and the other is connected to a second bit line BL2. Gates of the selection transistors M1 and M2 are connected to a word line WL. The pinned layer 30 in the magnetoresistive element 1 is connected through wirings to a ground line as shown in FIG. 14 and an initializing voltage (not shown).

The word lines WL are connected to an X-selector 62. The X-selector 62 selects the word line WL, which is connected to a target memory cell 71s selected from the magnetic memory cells 71, as a selection word line WLs, in writing or reading a data. The first bit lines BL1 are connected to a Y-side current termination circuit 64. The second bit lines BL2 are connected to a Y-selector 63. The Y-selector 63 selects the second bit line BL2, which is connected to the target memory cell 71s, as a selection second bit line BL2s. The Y-side current termination circuit 64 selects the first bit line BL1, which is connected to the target memory cell 71s, as the selection first bit line BL1s.

A Y-side current source circuit 65 supplies or draws a predetermined writing current ($I_{w1}$, $I_{w2}$) to and from the selection second bit line BL2s at the time of the data writing. A Y-side power source circuit 66 supplies a predetermined voltage to the Y-side current termination circuit 64, at the time of the data writing. As a result, the writing current ($I_{w1}$, $I_{w2}$) flows into the Y-selector 63 or flows out from the Y-selector 63. The X-selector 62, the Y-selector 63, the Y-side current terminal circuit 64, the Y-side current source circuit 65 and the Y-side power source circuit 66 configure a "writing current supplying circuit" for supplying the writing currents $I_{w1}$ and $I_{w2}$ to the magnetoresistive element 1.

In the data reading, the first bit line BL1 is set to "Open". A reading current load circuit 67 supplies a predetermined reading current to the selection second bit line BL2s. Also, the reading current load circuit 67 supplies a predetermined current to a reference second bit line BL2r connected to the reference cell 71r which has a reference first bit line BLr1 connected to the Y-side current termination circuit. A sensing amplifier 68 reads the data from the target memory cell 71s, on the basis of a difference between a potential of the reference second bit line BL2r and a potential of the selection second bit line BL2s, and outputs its data.

As mentioned above, in the present invention, one extension portion of the magnetization recording layer 10 has the property changing structure. At this time, when the non-magnetic layer 42 and the ferromagnetic layer 44 are used, the non-magnetic layer 42 and the ferromagnetic layer 44 can be formed extremely easily and simultaneously with the tunnel barrier layer 32 and the pinned layer 30 without introducing any additional process. Also, when the structure 41 having the step is used, the structure 41 can be formed extremely easily by only etching the part of the predetermined portion of the ground portion or magnetization recording layer 10. Thus, it is not necessary to form the artificial structure for generating the pin potential, such as the constriction whose manufacturing is difficult when the miniaturized structure causes the width of the magnetization recording layer 10 to be narrow, and the step which requires the additional process resulting in the cost increase. That is, it is possible to provide the MRAM that is adaptable for the miniaturization in the element and has the structure in which the number of processes is small.

Also, introducing of the property changing structure of the present invention enables the magnetic random access memory to be extremely easily initialized, as shown in FIG. 8A to FIG. 8D. That is, it is possible to provide the method of initializing the MRAM, in which the domain wall is introduced into the structure of the MRAM of the present invention and then the initialization is carried out.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention as defined by the claims.

This application is based upon and claims the benefit of priority from Japanese patent application No. 2008-180306 filed on Jul. 10, 2008, the disclosure of which is incorporated herein in its entirety by reference.

The invention claimed is:

1. A magnetic memory cell comprising:
    a magnetization recording layer configured to have a vertical magnetic anisotropy and include a ferromagnetic layer;
    a first terminal configured to be connected to one end of a first region in said magnetization recording layer;
    a second terminal configured to be connected to the other end of said first region;
    a non-magnetic layer configured to be arranged on said first region; and
    a magnetization pinned layer configured to be arranged on said non-magnetic layer and be located on the side opposite to said first region,
    wherein said magnetization recording layer includes:
    a first extension portion configured to be located outside said first terminal in said magnetization recording layer, and
    a property changing structure configured to be arranged in said first extension portion and substantially change a magnetization switching property of said magnetization recording layer.

2. The magnetic memory cell according to claim 1, wherein said magnetization recording layer includes:
    a second extension portion configured to be located outside said second terminal in said magnetization recording layer.

3. The magnetic memory cell according to claim 1, wherein said property changing structure includes:
    a ferromagnetic layer configured to be connected to said magnetization recording layer through an insulating layer.

4. The magnetic memory cell according to claim 1, wherein said property changing structure includes:
    a ferromagnetic layer configured to be directly connected to said magnetization recording layer.

5. The magnetic memory cell according to claim 1, wherein said property changing structure includes:
    an anti-ferromagnetic layer configured to be directly connected to said magnetization recording layer.

6. The magnetic memory cell according to claim 1, wherein said property changing structure includes:
    a step configured to be formed on said magnetization recording layer.

7. The magnetic memory cell according to claim 1, wherein said property changing structure includes:
    a thin film portion configured to be formed on said magnetization recording layer by etching.

8. The magnetic memory cell according to claim 1, wherein said non-magnetic layer and said magnetization pinned layer are laminated on and overlap with said first region.

9. The magnetic memory cell according to claim 1, further comprising:
    a sensor layer configured to be formed between said magnetization recording layer and said non-magnetic layer and include a ferromagnetic layer;
    wherein said sensor layer, said non-magnetic layer and said magnetization pinned layer are laminated on and overlap with said first region, partially.

10. The magnetic memory cell according to claim 9, wherein said sensor layer and said magnetization pinned layer have an in-plane magnetic anisotropy.

11. A magnetic random access memory comprising:
    a plurality of magnetic memory cells configured to be arranged in a matrix shape; and
    a writing current supplying circuit configured to supply a writing current at a time of a writing operation for said plurality of magnetic memory cells,
    wherein each of said plurality of magnetic memory cells includes:
    a magnetization recording layer having a vertical magnetic anisotropy and including a ferromagnetic layer,
    a first terminal connected to one end of a first region in said magnetization recording layer,
    a second terminal connected to the other end of said first region,
    a non-magnetic layer arranged on said first region, and
    a magnetization pinned layer arranged on said non-magnetic layer and is located on the side opposite to the first region,
    wherein said magnetization recording layer includes:
    a first extension portion located outside said first terminal in said magnetization recording layer, and a property changing structure arranged in said first extension portion and substantially changing a magnetization switching property of said magnetization recording layer.

12. The magnetic random access memory according to claim 11, wherein said magnetization recording layer includes:
a second extension portion configured to be located outside said second terminal in said magnetization recording layer.

13. The magnetic random access memory according to claim 11, wherein said property changing structure includes:
a ferromagnetic layer configured to be connected to said magnetization recording layer through an insulating layer.

14. The magnetic random access memory according to claim 11, wherein said property changing structure includes:
a ferromagnetic layer configured to be directly connected to said magnetization recording layer.

15. The magnetic random access memory according to claim 11, wherein said property changing structure includes:
an anti-ferromagnetic layer configured to be directly connected to said magnetization recording layer.

16. The magnetic random access memory according to claim 11, wherein said property changing structure includes:
a step configured to be formed on said magnetization recording layer.

17. The magnetic random access memory according to claim 11, wherein said property changing structure includes:
a thin film portion configured to be formed on said magnetization recording layer by etching.

18. A method of initializing a magnetic random access memory, wherein said magnetic random access memory includes:
a plurality of magnetic memory cells arranged in a matrix shape; and
a writing current supplying circuit supplying a writing current at the time of a writing operation for said plurality of magnetic memory cells,
wherein each of said plurality of magnetic memory cells includes:
a magnetization recording layer having a vertical magnetic anisotropy and including a ferromagnetic layer,
a first terminal connected to one end of a first region in said magnetization recording layer,
a second terminal connected to the other end of said first region,
a non-magnetic layer arranged on said first region, and
a magnetization pinned layer arranged on said non-magnetic layer and is located on the side opposite to the first region,
wherein said magnetization recording layer includes:
a first extension portion located outside said first terminal in said magnetization recording layer, and
a property changing structure arranged in said first extension portion and substantially changing a magnetization switching property of said magnetization recording layer,
said method of initializing said magnetic random access memory, comprising:
applying a magnetic field to a first direction to orient all magnetizations of said magnetization recording layer to said first direction;
applying a magnetic field to a second direction opposite to said first direction to orient a magnetization of a region, where said property changing structure is not arranged, to said second direction such that a domain wall is generated;
applying a magnetic field to said first direction to introduce said domain wall into said first region; and
supplying a current between said first terminal and said second terminal to drive said domain wall to a vicinity of said second terminal.

19. A method of initializing a magnetic random access memory, wherein said magnetic random access memory includes:
a plurality of magnetic memory cells arranged in a matrix shape; and
a writing current supplying circuit supplying a writing current at the time of a writing operation for said plurality of magnetic memory cells,
wherein each of said plurality of magnetic memory cells includes:
a magnetization recording layer having a vertical magnetic anisotropy and including a ferromagnetic layer,
a first terminal connected to one end of a first region in said magnetization recording layer,
a second terminal connected to the other end of said first region,
a non-magnetic layer arranged on said first region, and
a magnetization pinned layer arranged on said non-magnetic layer and is located on the side opposite to the first region,
wherein said magnetization recording layer includes:
a first extension portion located outside said first terminal in said magnetization recording layer, and
a property changing structure arranged in said first extension portion and substantially changing a magnetization switching property of said magnetization recording layer,
said method of initializing said magnetic random access memory, comprising:
applying a magnetic field to a first direction to orient all magnetizations of the magnetization recording layer to said first direction;
applying a magnetic field to a second direction opposite to said first direction to orient a magnetization of a region, where said property changing structure is arranged, to said second direction such that a domain wall is generated;
applying a magnetic field to said second direction to introduce said domain wall into said first region; and
supplying a current between said first terminal and said second terminal to drive said domain wall to a vicinity of said second terminal.

20. A method of writing a magnetic random access memory, wherein said magnetic random access memory includes:
a plurality of magnetic memory cells arranged in a matrix shape; and
a writing current supplying circuit supplying a writing current at the time of a writing operation for said plurality of magnetic memory cells,
wherein each of said plurality of magnetic memory cells includes:
a magnetization recording layer having a vertical magnetic anisotropy and including a ferromagnetic layer,
a first terminal connected to one end of a first region in said magnetization recording layer,
a second terminal connected to the other end of said first region,
a non-magnetic layer arranged on said first region, and a magnetization pinned layer arranged on said non-magnetic layer and is located on the side opposite to the first region, wherein said magnetization recording layer includes:

a first extension portion located outside said first terminal in said magnetization recording layer, and a property changing structure arranged in said first extension portion and substantially changing a magnetization switching property of said magnetization recording layer, said method of writing said magnetic random access memory, comprising:

rising up a writing current pulse at a first time period; and falling said writing current pulse at a second time period longer than the first time period.

* * * * *